(12) United States Patent
Nishino et al.

(10) Patent No.: US 8,081,292 B2
(45) Date of Patent: Dec. 20, 2011

(54) EXPOSURE SYSTEM AND METHOD OF MANUFACTURING A SEMICONDUCTOR DEVICE

(75) Inventors: Katsuhiro Nishino, Chiba (JP); Takatsugu Yoshida, Toyama (JP)

(73) Assignee: Panasonic Corporation, Osaka (JP)

( * ) Notice: Subject to any disclaimer, the term of this patent is extended or adjusted under 35 U.S.C. 154(b) by 559 days.

(21) Appl. No.: 12/207,233

(22) Filed: Sep. 9, 2008

(65) Prior Publication Data

US 2009/0073409 A1    Mar. 19, 2009

(30) Foreign Application Priority Data

Sep. 14, 2007 (JP) ................................. 2007-238981

(51) Int. Cl.
*G03B 27/52* (2006.01)
*G03B 27/68* (2006.01)
*G03B 27/54* (2006.01)
*G03B 27/74* (2006.01)
*G03B 27/58* (2006.01)
*G03B 27/32* (2006.01)

(52) U.S. Cl. ................. 355/55; 355/52; 355/67; 355/68; 355/72; 355/77

(58) Field of Classification Search .................... 355/52, 355/53, 55, 67–71, 72, 75, 77; 356/123, 356/614–616, 620, 624; 430/5, 30, 311; 250/492.1, 492.2, 492.22, 548

See application file for complete search history.

(56) References Cited

U.S. PATENT DOCUMENTS

| | | | | |
|---|---|---|---|---|
| 4,540,277 A | * | 9/1985 | Mayer et al. ..................... | 355/53 |
| 5,241,188 A | * | 8/1993 | Mizutani ....................... | 250/548 |
| 5,521,036 A | * | 5/1996 | Iwamoto et al. ................. | 430/22 |
| 6,624,879 B2 | * | 9/2003 | Imai ................................ | 355/53 |
| 6,657,703 B2 | * | 12/2003 | Kurosawa ....................... | 355/55 |
| 6,714,281 B1 | * | 3/2004 | Amano et al. ................... | 355/55 |
| 7,142,315 B1 | * | 11/2006 | Lange et al. .................... | 356/632 |
| 7,566,893 B2 | * | 7/2009 | Konda et al. ................... | 250/548 |
| 2002/0041377 A1 | | 4/2002 | Hagiwara et al. | |
| 2002/0048857 A1 | * | 4/2002 | Saito et al. ..................... | 438/140 |
| 2003/0090661 A1 | * | 5/2003 | Kobayashi ..................... | 356/400 |
| 2004/0080737 A1 | * | 4/2004 | Jasper et al. .................... | 355/55 |
| 2005/0128453 A1 | * | 6/2005 | Miura ............................ | 355/55 |
| 2010/0129741 A1 | * | 5/2010 | Bijvoet ........................... | 430/30 |

FOREIGN PATENT DOCUMENTS

JP    10-254123    9/1998

* cited by examiner

*Primary Examiner* — Peter B Kim
*Assistant Examiner* — Christina Riddle
(74) *Attorney, Agent, or Firm* — McDermott Will & Emery LLP

(57) ABSTRACT

In an exposure system and semiconductor device manufacturing method relating to the present invention, an image of spatial image mark body through a reduction projection lens is projected onto a spatial image projection plate arranged on a wafer stage by irradiating the spatial image mark body arranged on a reticle stage with an exposure light. The spatial image mark body has a plurality of spatial image marks arranged in a same plane. At projection positions of images of each spatial image mark on the spatial image projection plate, spatial image openings are equipped with differing positions in an optical axis direction of the exposure light. A focus curve with a single exposure can be obtained, without moving the wafer stage in the optical axis direction, by respective measurements of optical intensities of images of each spatial image mark through each opening thereby enabling to calculate the best focus position.

19 Claims, 5 Drawing Sheets

EXPOSURE SYSTEM AND METHOD OF MANUFACTURING A SEMICONDUCTOR DEVICE

CROSS-REFERENCE TO RELATED APPLICATION

The present application claims the benefit of Japanese Patent Application No. 2007-238981 filed Sep. 14, 2007, the subject matter of which is incorporated herein by reference.

BACKGROUND OF THE INVENTION

1. Field of the Invention

The present invention relates to an exposure system used in an exposure process for manufacturing semiconductor devices, etc. and a semiconductor device manufacturing method that includes a step of adjusting each wafer to the best focus by measuring a focus setting value of an exposure apparatus for each wafer when exposure process is performed on a lot-to-lot basis.

2. Description of the Related Art

In a conventional manufacturing process of semiconductor devices such as semiconductor integrated circuits or the like, an exposure apparatus having a large numerical aperture is used to improve a resolution for a micro-sized element pattern. However, as the numerical aperture increases, the allowable focal depth is suddenly reduced due to the distinct formation of the element pattern. Because of this, in the exposure process, it becomes necessary to perform a high precision focus setting for the exposure apparatus and an exposure within an appropriate focal depth range. For example, a focal depth of 0.60 µm is required when the design rule is 0.15 µm. Therefore, a focus measurement is extremely important for executing a high degree of precision in the focus setting.

There have been various conventional methods for the focus measurement. Generally, either a resist image focus measurement or a spatial image focus measurement is implemented, and the best focus is calculated prior to exposure. The focus measurement is implemented to align the surface of the wafer (substrate) mounted on a wafer stage of the exposure apparatus with the focal plane (image plane) of a projection lens of the exposure apparatus. By implementing the focus measurement, the reticle pattern image for each exposure shot can be correctly formed on the wafer surface when exposing the wafer.

In the resist image focus measurement, exposure is performed in a plurality of states having relatively changed positional relationships in an optical axis direction of an exposure light (hereafter referred to simply as an optical axis direction) to the surface of the wafer mounted on the wafer stage of the exposure apparatus and the focal plane of the projection lens of the exposure apparatus, and then a positional relationship (best focus position) to enable formation of a favorable resist pattern is derived. The resist image focus measurement is executed by using a focus sensor. A known focus sensor is a grazing-incidence type auto-focus measurement system (hereafter referred to as an AF system). FIG. 3 is an outline structural diagram showing a constitution of an AF system.

As shown in FIG. 3, the AF system 50 is constituted from a light source 51, a light transmission slit 52, a light receiving slit 53, and a light receiving unit 54. Such AF system 50 performs grazing-incidence of an image formation luminous flux 55 onto the surface of a wafer 12 mounted on a wafer holder 11 on a wafer stage 15 provided by the exposure apparatus, and then forms a slit image 56 on the surface of the wafer 12. Further, photoelectric detection of the reflected light is achieved through the light receiving slit 53 and the light receiving unit 54. The AF system 50 has a two dimensional multipoint AF sensor as the light receiving unit 54, and detects positions in the optical axis direction at multiple points on the wafer surface. Although only a single AF system is shown in FIG. 3, a plurality of AF systems can be equipped.

The AF system 50 detects a camber and unevenness of an exposure area on the wafer 12 and calculates a correction amount for matching the surface of the exposure area with the best focus position. Here, the correction amount is a movement amount (a focus offset) of the wafer stage 15 in the optical axis direction and a tilting amount (a leveling offset) from the level plane. The wafer stage 15 is driven in accordance with the calculated correction amount. In general, a movement in the optical axis direction of the wafer stage 15 based on the focus offset, i.e. the action for aligning a position in the optical axis direction with the focal plane, is called focusing, and a movement for changing the tilt of the wafer surface based on the leveling offset, i.e. the action for aligning the wafer surface with the level plane, is called leveling.

When deriving the best focus position using the resist image focus measurement, a reticle for use in the focus measurement that includes a focus measurement pattern is first mounted in the exposure apparatus and then the focus measurement pattern is transferred to a resist film applied to the surface of a wafer. At this time, the focus setting value set in the exposure apparatus changes, for example, according to each exposure event for a fixed number of shots. By so doing, the focus measurement patterns that correspond to each focus setting value is transferred to the resist film on the wafer. In this method, a certain period of time is required for manufacturing the wafer for use in the focus measurement because exposures for the focus measurement patterns are performed successively a plurality of times on the wafer with different focus setting values. Because time depends on wafer conditions it cannot be said for sure, but a time of about 5 to 15 minutes is necessary for manufacturing the wafer for use in the focus measurement. Here, the wafer conditions indicate the process conditions such as exposure conditions that are determined according to the type of the resist film and exposure time.

After developing the wafer on which the focus measurement patterns are transferred described above, a dimension, such as a line width, of a resist pattern corresponding to each focus setting value is measured. For example, the line width at the bottom of the resist pattern, i.e. the line width at the lower surface of the resist pattern, is measured by an electron scanning microscope. Moreover, the measurement position of the resist pattern is established according to the process conditions used in an actual production of the semiconductor device. Based on the measurement result, a graph is created with the focus setting values of the exposure apparatus as the horizontal axis and the measured dimensions as the vertical axis. Based on the curve obtained in this way, the best focus can be calculated.

The relationship between the focus setting value and the resist pattern dimension obtained by the above resist image focus measurement is inherent to the exposure apparatus and is normally very stable for time. Therefore, the relationship between the focus setting value and the resist pattern dimension obtained by the resist image focus measurement does not commonly change once set as the constant in the exposure apparatus. However, for example, when a significant change is generated in the state of an optical system of the exposure apparatus such as replacing the wafer stage drive unit or adjusting the projection lens aberration, then the resist image focus measurement will be re-implemented.

Art described in, for instance, Japanese Published Unexamined Patent Application No. H10-254123, can be given as a conventional technology relating to the calculation of the best focus using the resist image focus measurement. This Prior Art Citation discloses the implementation of the focus measurement by using a reticle that provides a plurality of stepped surfaces so that the distances to a wafer having a resist film at the time of being placed on a reticle stage are respectively different. With each stepped surface of the reticle, mask patterns are respectively formed that correspond to the pattern for use in the focus measurement. When exposing the resist film on the wafer by using the reticle, even if the focus setting value of the exposure apparatus is constant, it is possible to obtain an equivalent resist pattern when changing the focus setting value of the exposure apparatus. In other words, the relationship between the focus setting value and the resist pattern dimension can be obtained without changing the focus setting value of the exposure apparatus. With this method, because the focus setting value of the exposure apparatus does not change, the manufacturing time of the wafer for use in the focus measurement can be shortened.

On the other hand, the spatial image focus measurement is implemented to also correct the gradual slippage over time that occurs in the measurement result of the AF system 50 after the result of the resist image focus measurement is set as the constant in the exposure apparatus. The correction of the gradual slippage over time is realized by calibrating of the AF system 50. Regularly implemented calibrating of the AF system 50 for correcting the gradual slippage over time is called a focus calibration. The main cause of the gradual slippage over time is the fluctuation in atmospheric pressure surrounding the environment of the exposure apparatus.

An explanation based on FIG. 4 is given of a procedure of the focus calibration. FIG. 4 is an outline structural diagram showing an exposure apparatus and a focus measurement system for performing the focus calibration attaching thereto. The exposure apparatus irradiates an exposure light 1 to a reticle 3 arranged on a reticle stage 2 and projects an image of pattern 3a on reticle 3 onto a wafer stage 15 through a reduction projection lens 5. In the focus calibration, the exposure light 1 is irradiated to a spatial image mark body 104 that provides a spatial image mark 104a placed on the reticle stage 2. At this time, a spatial image projection plate 106 mounted on the wafer stage 15 is arranged at the image formation position of the reducing projection lens 5. The spatial image projection plate 106 has an opening 106a that corresponds to the image of the spatial image mark 104a and the opening 106a is arranged at the image formation position of the spatial image mark 104a. The light entering into the opening 106a is reflected by a mirror 7 arranged immediately below the opening 106a and enters a light receiving sensor 121. In other words, the image of the spatial image mark 104a is detected by the light receiving sensor 121 as optical intensity.

The optical intensity measurement by the light receiving sensor 121 is implemented respectively in a state in which the wafer stage 15 is arranged in differing positions along the optical axis direction (vertical direction in FIG. 4), in other words a state in which the focus setting value of the exposure apparatus is set to different values. By so doing, the relationship between the focus setting value of the exposure apparatus and the optical intensity of the projection image can be obtained. FIG. 5 is a drawing that shows the relationship between the wafer stage position in the optical axis direction and the optical intensity of the projection image of the spatial image mark. The horizontal axis in FIG. 5 corresponds to the wafer stage position in the optical axis direction and the horizontal axis corresponds to the optical intensity of the projection image. In this case, the position of the wafer stage 15 at maximum contrast of the projection image is the best focus position. In this method, a certain period of time is required for the focus measurement because the position in the optical axis direction of the wafer stage 15 is changed and then the optical intensity of the projection image is measured. A time of, for instance, 30 seconds to 60 seconds is required.

In an exposure process for mass producing semiconductor devices, a predetermined number of wafers (for example 25 wafers) as a lot are to be processed for an improvement of operation efficiency. In this case, the quality of the semiconductor device is affected when a variance in focus of 0.05 μm occurs between wafers belonging to the same lot. This type of focus variance is caused by changes in the focus properties of the projection lens due to such things as a rise in temperature due to irradiation of the exposure light 1 and change in temperature of the environment either within or outside the exposure apparatus. In order to minimize slippage in the best focus position in an exposure apparatus, the focus correction is performed on the projection lens itself.

However, when the focus control amount by the projection lens exceeds a fixed value at the time of the focus correction, the focus variance becomes more pronounced. Here, the focus control amount is an inherent value in the exposure apparatus. To reduce focus variance caused by the focus control of the projection lens, the focus calibration described above must be performed immediately prior to exposure on each wafer. In other words, when the focus calibration is performed on each wafer immediately prior to exposure and the focus control is performed by adjusting the position in the optical axis direction of the wafer stage for each wafer, the focus control amount by the projection lens is reduced and does not exceed the fixed value. As a result, the focus variance occurring in the exposure process for each wafer within the same lot can be reduced.

SUMMARY OF THE INVENTION

However, the processing time for each single wafer increases when performing the focus calibration on each wafer immediately prior to exposure thereby reducing the throughput. For example, the time required for the spatial image focus measurement is 30 seconds to 60 seconds, and the time required for exposure processing to expose an integrated circuit pattern to a wafer is also 30 seconds to 60 seconds. In this case, the time required to process a single wafer is twice that compared to not performing the focus calibration immediately before exposing each wafer.

In recent years, as process generations advance requiring more detailed patterns, prices of the exposure apparatuses have escalated. This increases the manufacturing cost for semiconductor devices. In order to control the manufacturing cost increasing, an increase in the throughput is required for the exposure apparatus. Therefore, an increase in the wafer processing time is not allowed in the exposure process. For example, by executing the resist image focus measurement as disclosed in the Prior Art Citation, the resist image focus measurement can be executed quickly. However, since it is a method for deriving the best focus by measuring the resist pattern dimension, the best focus adjustment requires a certain period of time. Further, since it is not a method for the spatial image focus measurement, implementing immediately prior to exposure on each wafer is difficult.

The present invention has the objective of providing an exposure system and semiconductor device manufacturing method that has the ability to perform exposure by optimizing the focus for each wafer to the best focus without reducing throughput in exposure process of wafers per lot unit.

In order to achieve the above objective, the present invention adopts the technical means described below. First, the present invention assumes an exposure system for projecting a pattern formed on a reticle mounted on a reticle stage through a projection lens onto a substrate where a photosensitive resin film is formed mounted on a wafer stage. Then, the exposure system that relates to the present invention comprises a spatial image mark body that has a plurality of spatial image marks arranged in a same plane and is placed between an exposure light source for irradiating an exposure light and the projection lens, and a spatial image projection plate that has a main surface that slants with respect to a substrate mounting surface of the wafer stage and where the plurality of spatial image marks is projected through the projection lens. Further, the exposure system comprises a detector for detecting optical intensities of the images of each spatial image mark projected onto the spatial image projection plate, respectively. Here, the slanting main surface includes, in addition to a smooth slanting surface, also an actual slant such as a stepped stair shape that combines differing flat surfaces.

According to the present constitution, a focus curve can be obtained with only a single exposure of the spatial image mark body. Therefore, the best focus position of the spatial image can be calculated in an extremely short time.

In addition, the exposure system preferably comprises a unit adjusting a position of the wafer stage in an optical axis direction of the exposure light so that a surface position of the substrate mounted on the wafer stage becomes a best focus position calculated based on the optical intensities of the images of each spatial image mark. Additionally, the exposure system comprises a unit calculating automatically the best focus position based on the optical intensity of the image of each spatial image mark. Moreover, the spatial image mark body can be placed on the reticle stage. Further, the spatial image projection plate can be placed on the wafer stage.

In addition, the exposure system can also adopt a construction in which the spatial image projection plate has openings corresponding to each projection position of the images of spatial image marks projected onto the spatial image projection plate at the time that the exposure light enters the spatial image mark body, and the exposure light that passed through the each opening is lead to the detector.

On the other hand, the present invention can also provide a method of manufacturing a semiconductor device by using an exposure system for projecting a pattern formed on a reticle mounted on a reticle stage through a projection lens onto a substrate where a photosensitive resin film is formed mounted on a wafer stage. Namely, in the method of manufacturing a semiconductor device relating to the present invention, first, a substrate is mounted onto the wafer stage. Next, a spatial image mark body having a plurality of spatial image marks arranged in a same plane is placed on an optical axis of an exposure light between an exposure light source for irradiating the exposure light and the projection lens and also a spatial image projection plate having a main surface that slants with respect to a substrate mounting surface of the wafer stage and where a plurality of spatial image marks are projected through the projection lens is placed on the optical axis of the exposure light. Successively, a plurality of spatial image marks is projected onto the spatial image projection plate through the projection lens by irradiating the spatial image mark body with the exposure light. A best focus position is calculated based on optical intensities of the images of each spatial image mark projected on the spatial image projection plate. Further, a focus setting value of the exposure system is corrected so that a surface position of the substrate mounted on the wafer stage becomes the calculated best focus position, and an exposure of the substrate is performed by using the corrected focus setting value.

When the substrate belongs to a lot constituted from a plurality of substrates, the correcting step of correcting a focus setting value of the exposure system is implemented for the exposures each of predetermined number of substrates contained in the lot. Further, the correcting step can also be implemented in every exposure to each of substrates contained in the lot.

In addition, the best focus position, for example, is calculated by converting a position of the spatial image projection plate in the optical axis direction of the exposure light to a focus setting value, the position corresponding to an optical intensity representing an extreme value in a curve showing relations between optical intensity of each projected spatial image mark on the spatial image projection plate and the position of the spatial image projection plate in the optical axis direction of the exposure light at the position of each projected spatial image mark.

According to the present invention, since the focus curve is obtained by a single exposure, the best focus position can be calculated in an extremely short period of time. Therefore, when performing exposure process of substrates per lot unit, the exposure process can be implemented to optimize the focus for each substrate without reducing the throughput. As a result, the focus variance can be controlled between each wafer belonging to the same lot without reducing throughput thereby enabling to reduce in manufacturing cost.

The foregoing and other objects, features, aspects and advantages of the present invention will become more apparent from the following detailed description of the present invention when taken in conjunction with the accompanying drawings.

DETAILED DESCRIPTION OF THE DRAWINGS

DETAILED DESCRIPTION OF PREFERRED EMBODIMENTS

A detailed description with reference to drawings will be described hereafter of a preferred embodiment of the present invention. A reduction projection exposure apparatus is specifically used in the following preferred embodiment for the present invention.

Figure 1:
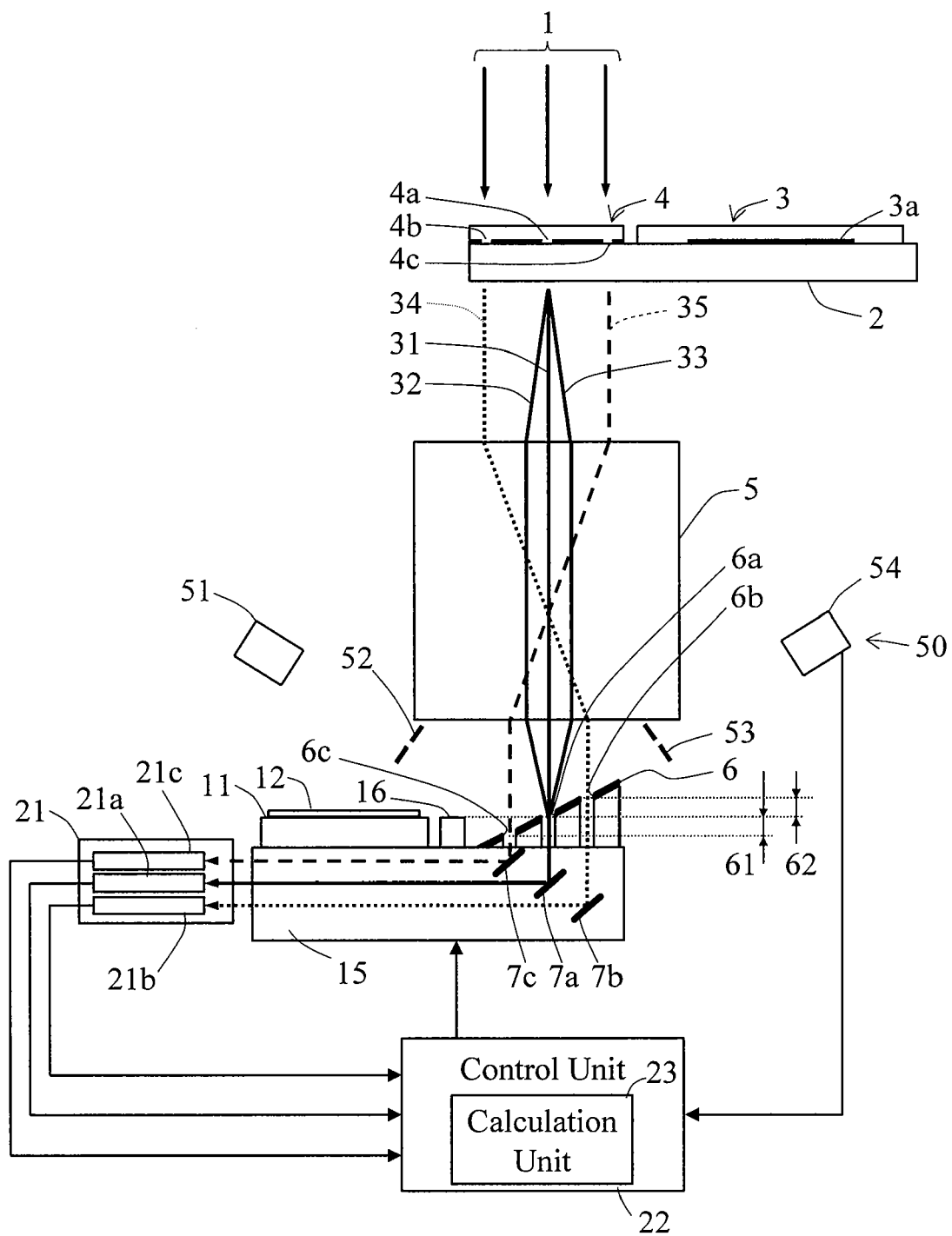
FIG. 1 is an outline structural diagram showing an exposure apparatus in an embodiment relating to the present invention.

FIG. 1 is an outline structural diagram to explain the composition of an exposure apparatus in the embodiment relating to the present invention. As shown in FIG. 1, the exposure apparatus of the present embodiment irradiates an exposure light 1 that exits from an exposure light source (not shown) to a reticle 3 mounted on the reticle stage 2, and an element pattern 3a formed on the reticle 3 undergoes image formation on a wafer 12 through a projection lens 5. The reticle stage 2 is arranged between the exposure light source and the projection lens 5. Further, a spatial image mark body 4 is arranged on the reticle stage 2 and which arranges a plurality of spatial image marks 4a, 4b, and 4c in a same plane. The reticle stage 2 is structured with the ability to move in an orthogonal direction (here, a horizontal direction) with the optical axis of the exposure light 1, and can selectively arrange the reticle 3 and spatial image mark body 4 to be on the optical axis of the exposure light 1.

A wafer stage 15 mounted with the wafer 12 subject to exposure is arranged on the bottom side (exposure light exit side) of the projection lens 5. A focusing, leveling, and lateral movement (for example, movement over the wafer between exposure shots) of the wafer stage 15 is implemented by a control unit 22 driving the drive mechanism (not shown). Moreover, a focus offset and leveling offset for the exposure apparatus by the resist image focus measurement described above is calculated based on the measurement result of an auto-focus measurement system 50 (hereafter referred to as the AF system 50) and a relationship, obtained in advance, between the focus setting value and the resist pattern dimension. The AF system 50 is constituted in the same manner as the conventional art from a light source 51, a light transmission slit 52, a light receiving slit 53, and a light receiving unit 54. The AF system 50 has already been described so a description thereof is omitted here.

On the wafer stage 15, a wafer holder 11 mounted with the wafer 12 subject to exposure, a focus standard position confirmation body 16 to be described in detail hereafter, and a spatial image projection plate 6 are arranged. In the present embodiment, the wafer holder 11, the focus standard position confirmation body 16 and the spatial image projection plate 6 are arranged in mutually differing locations. Accordingly, when exposing the wafer 12 mounted on the wafer holder 11, the focus standard position confirmation body 16 and the spatial image projection plate 6 do not interfere with the exposure of the wafer 12.

As shown in FIG. 1, the spatial image projection plate 6 provided by the exposure apparatus of the present embodiment differs from a conventional spatial image projection plate 106 of the conventional art in that it has a structure in which the surface is slanted with respect to an essentially flat surface (wafer mounting surface) of the wafer stage 15. Further, the spatial image projection plate 6 provides a plurality of minute spatial image openings 6a, 6b, and 6c. The light that enters into the spatial image openings 6a, 6b, 6c enter into a light receiving sensor 21 by being respectively reflected by mirrors 7a, 7b, and 7c placed immediately below each of the spatial image openings. The light receiving sensor 21 provides internally a plurality of individual light receiving sensors 21a, 21b and 21c for measuring the respective light intensities that enter into each of the spatial image openings 6a, 6b and 6c.

The arrangement of the spatial image opening 6a, 6b, 6c corresponds to the arrangement of the spatial image mark 4a, 4b, 4c. In other words, the arrangement of the spatial image opening 6a, 6b, 6c matches the arrangement of the projection images of the spatial image marks 4a, 4b, 4c. Further, the planar shape of each spatial image opening 6a, 6b, 6c (shape as viewed from an orthogonal direction to the horizontal plane) is the same as the planer shape of the projection images of each of the corresponding spatial image marks 4a, 4b, 4c, respectively. In other words, the pattern arrangement multiplying the reduction projection power by the pattern arrangement of the spatial image marks 4a, 4b, 4c becomes the pattern arrangement of the spatial image openings 6a, 6b, 6c formed on the spatial image projection plate 6. Further, in the present embodiment, the position in the optical axis of the exposure light (vertical direction in FIG. 1. Hereafter simply referred to as the optical axis direction) of each of the spatial image marks 4a, 4b, 4c become the same position as the optical axis direction of the element pattern 3a formed on the reticle 3. Each of the spatial image marks 4a, 4b, 4c are all the same dimension and same planar shape. In the present embodiment, each spatial image mark is constituted by an isolated space pattern.

For example, in the case of the exposure apparatus for ¼ reduction projection exposure, the line width of the isolated space pattern constituting the spatial image marks 4a, 4b, 4c can be made to be 0.8 µm. In this case, the line width of the image undergoes reduction projection and becomes 0.2 µm at the projection position of the projection lens 5. The spacing between each of the spatial image marks 4a, 4b, 4c can be made to be 400 µm. In this case, the spacing between the images at the projection position of the projection lens 5 becomes 100 µm. Accordingly, in this example, on the spatial image projection plate 6, the spatial image openings 6a, 6b, 6c with a line width of 0.2 µm is arranged with a spacing of 100 µm in a horizontal view. Moreover, the spacing and dimensions of each spatial image opening 6a, 6b, 6c can be freely changed according to the focus precision required by the process for producing semiconductor devices.

In addition, for the purposes of explanation in the present embodiment, there are three spatial image marks belonging to the spatial image mark body 4, but a greater number of spatial image marks may also be arranged. For example, 20 to 30 spatial image marks are preferred to be arranged in the specific diameter direction (lateral direction in FIG. 1) of the wafer 12. In addition to the above description, each spatial image mark 4a, 4b, 4c is constituted by the isolated space pattern, but if the optical intensity can be easily obtained by the light receiving sensor 21, then an isolated line pattern or other pattern shape can also be used. Further, the dimension and spacing of each spatial image mark 4a, 4b, 4c can be freely changed according to the focus precision required by the process for producing semiconductor devices.

In the exposure apparatus having the above constitution, the spatial image focus measurement is executed in the following manner. In case of executing the spatial image focus measurement, first, the spatial image mark body 4 mounted on the reticle stage 2 is arranged on the optical axis of the exposure light 1. Further, the spatial image projection plate 6 is arranged on the optical path of the exposure light 1 after passing through the projection lens 5.

For example, when the exposure light 1 enters the spatial image mark 4a constituting the spatial image mark body 4, the exposure light 1 is diffracted by the spatial image mark 4a. The diffracted light takes the path indicated by path 31, path 32, and path 33 then enters the projection lens 5. The diffracted light undergoes reduction projection by the projection lens 5 and projects the image of the spatial image mark 4a to the spatial image opening 6a of the spatial image projection plate 6. The light that includes the image of the spatial image mark 4a changes its direction by the mirror 7a immediately below the spatial image opening 6a to a nearly parallel direction with the surface of the wafer stage 15 and enters the individual light receiving sensor 21a. In the same manner, when the exposure light 1 enters the spatial image mark 4b, the image of the spatial image mark 4b is projected to the spatial image opening 6b. The light that includes the image of the spatial image mark 4b changes its direction by the mirror 7b immediately below the spatial image opening 6b and enters the individual light receiving sensor 21b. Further, when the exposure light 1 enters the spatial image mark 4c, the image of the spatial image mark 4c is projected to the spatial image opening 6c. The light that includes the image of the spatial image mark 4c changes its direction by the mirror 7c immediately below the spatial image opening 6c and enters the individual light receiving sensor 21c. Moreover, in FIG. 1, only paths 34 and 35 are indicated in the drawing to correspond with path 31 of the spatial image mark 4a as the paths of the diffracted light of the spatial image marks 4b and 4c.

The light received by each of the individual light receiving sensors 21a, 21b, 21c is converted to an electric signal by each of the individual light sensors according to their respective optical intensities and the electric signals are input into the control unit 22. The electric signals output from each of the light receiving sensors 21a, 21b, 21c indicate the optical intensities of the images of the spatial image marks projected to spatial image projection plates arranged in a different position in the optical axis direction. In other words, even if the position in the optical axis direction of the wafer stage 15, i.e. the position in the vertical direction, is fixed, equivalent optical intensities can be obtained as that when changing the position of the wafer stage 15 in the optical axis direction. Accordingly, the relationship (the focus curve) between the position of the wafer stage 15 in the optical axis direction and the optical intensities of the images of the spatial image marks can be obtained without changing the position of the wafer stage 15 in the optical axis direction. In the constitution of the present embodiment, because the focus curve can be obtained without changing the position of the wafer stage 15 in the optical axis direction, the best focus position can be derived in an extremely short time.

Figure 2:
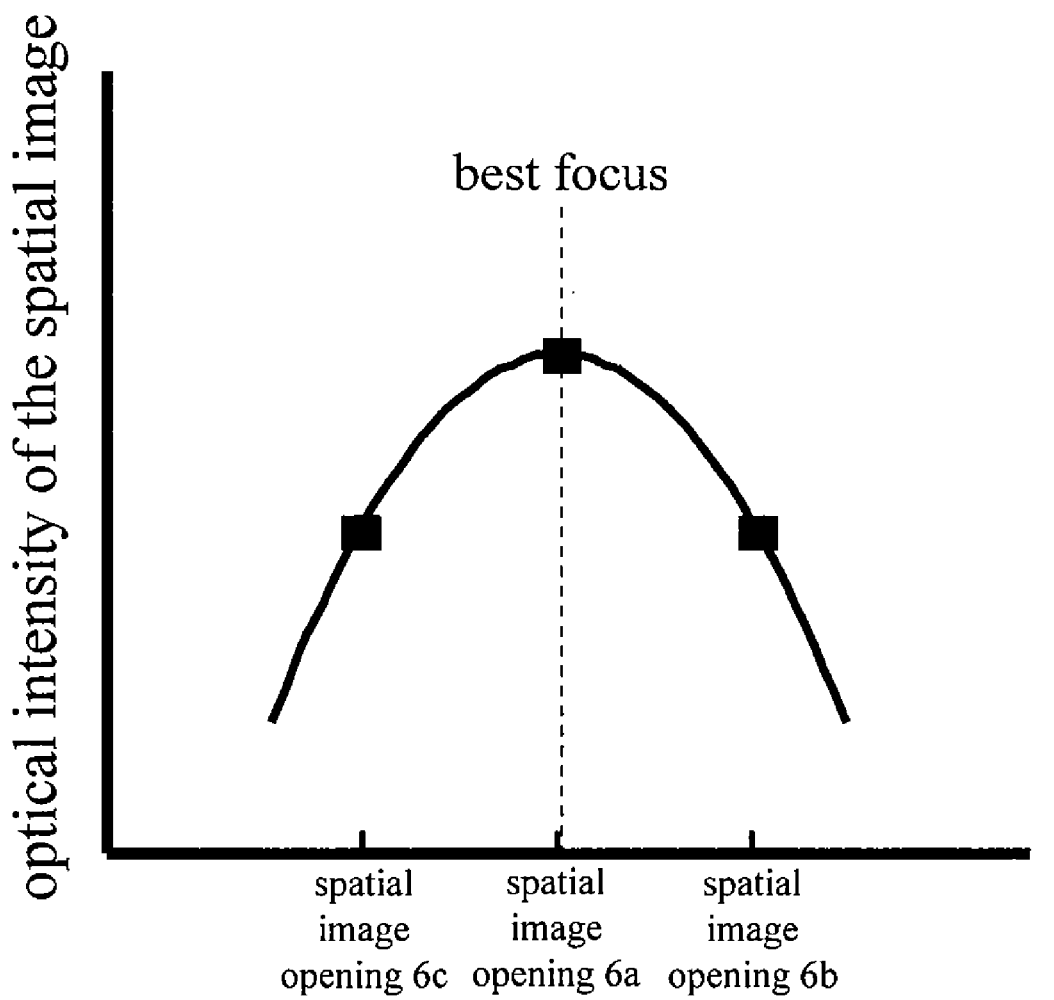
FIG. 2 is a drawing showing a relationship between positions in optical axis direction of spatial image openings and optical intensities of the spatial images in an embodiment relating to the present invention.
Figure 3:
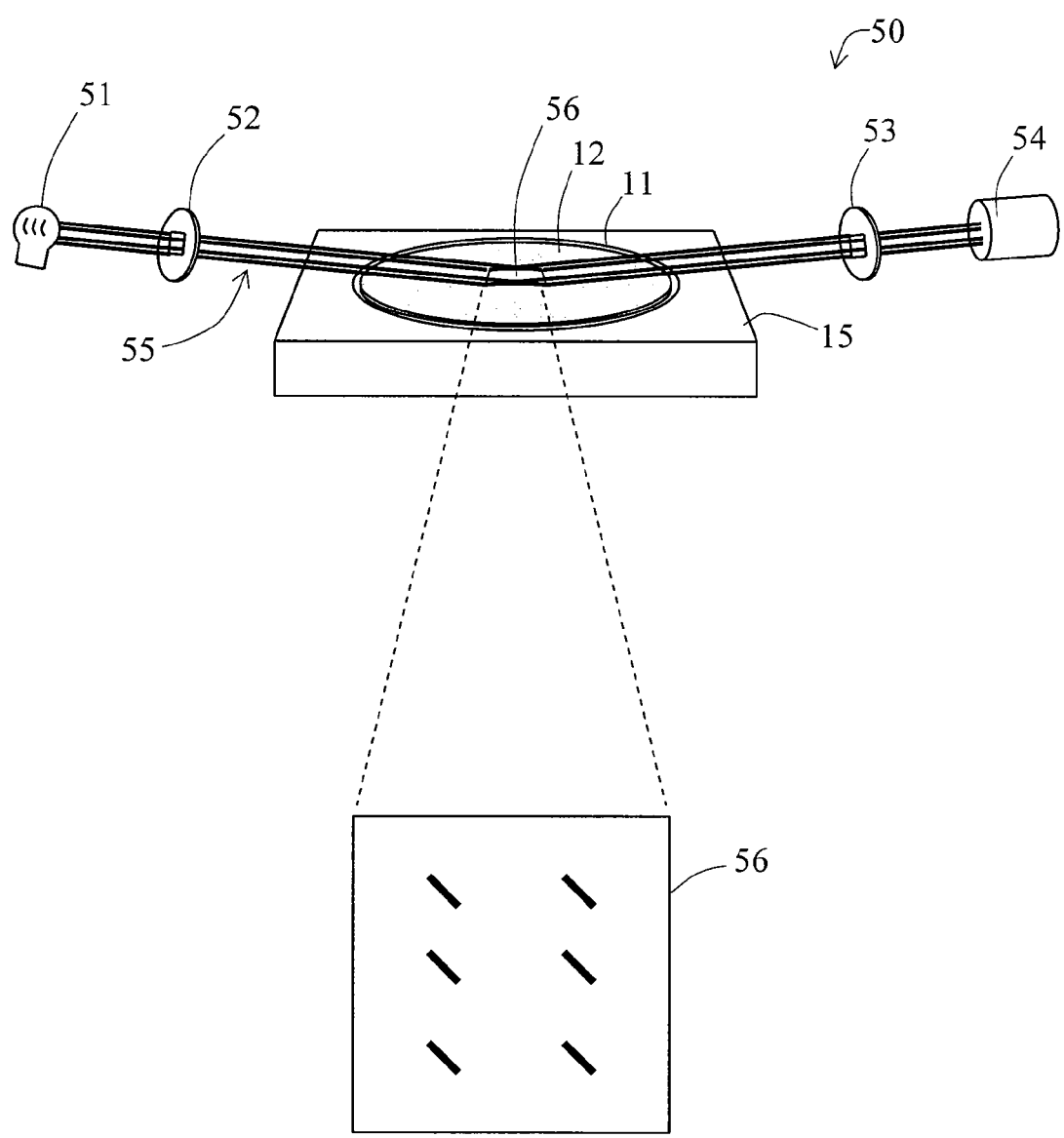
FIG. 3 is an outline structural diagram showing the AF system.
Figure 4:
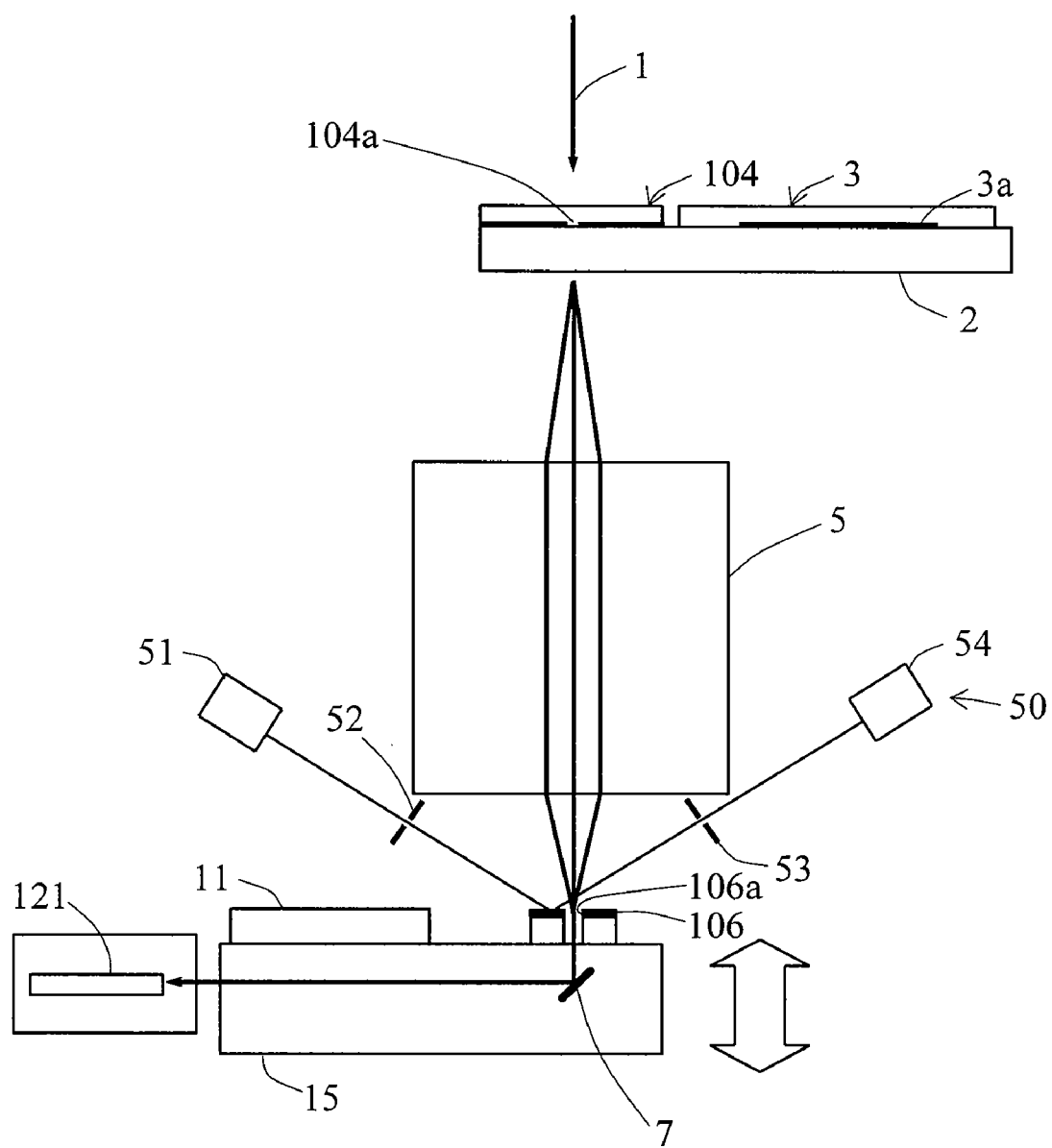
FIG. 4 is an outline structural diagram showing a conventional exposure apparatus.
Figure 5:
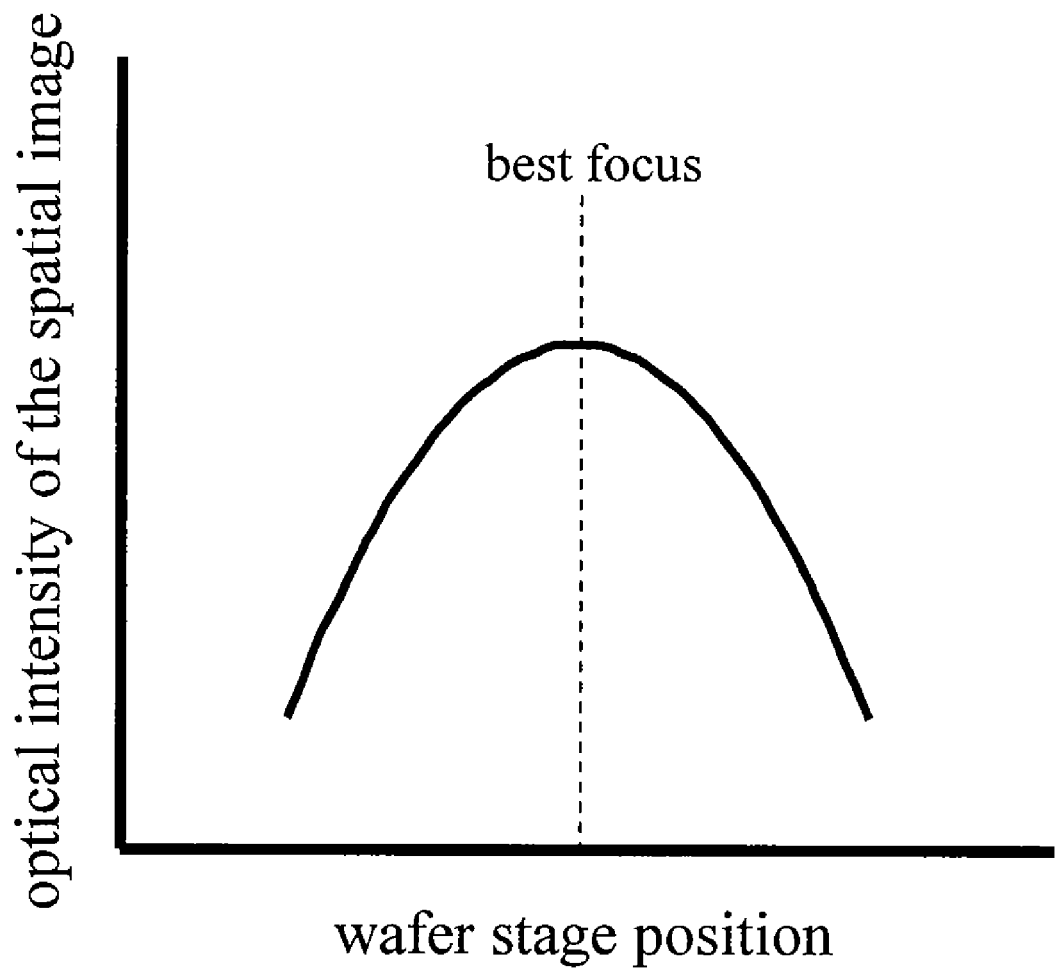
FIG. 5 is a drawing showing a relationship between wafer stage positions in optical axis direction and optical intensities of spatial images.

The best focus position can be calculated, for instance, in the following manner. First, as shown in FIG. 2, based on the optical intensities of the images of the spatial image marks at the positions of the spatial image openings 6a, 6b, 6c, the measurement values are plotted with the position along the optical axis direction of the spatial image openings 6a, 6b, 6c as the horizontal axis and the optical intensities of the images of each of the spatial image marks as the vertical axis. For example, the position along the optical axis direction of the spatial image openings 6a, 6b, 6c is the height from the surface of the wafer stage 15 to each of the spatial image openings 6a, 6b, 6c. Further, the height of the spatial image opening that becomes the optical intensity representing an extreme value in the focus curve can be calculated from the curve indicating the relationship between the optical intensities of the spatial image marks and the position in the optical axis of the spatial image projection plate. This spatial image opening height is the best focus position.

In addition, the best focus position calculated in the manner described above enables the conversion to the focus setting value of the exposure apparatus by using the focus standard position confirmation body 16 as will be described hereafter. In case of the present embodiment, in FIG. 1, the position in the optical axis direction of the spatial image opening 6a centrally located is the same as the position in the optical axis direction of the surface of the focus standard surface confirmation body 16. The focus standard surface confirmation body 16 is constituted with the ability for measuring the surface position by the AF system 50. Therefore, according to the present constitution, the position in the optical axis direction of the spatial image opening 6a can be accurately measured by measuring the surface position of the focus standard surface confirmation body 16 with the AF system 50. Further, the position in the optical axis direction of the spatial image opening 6a measured by the AF system 50 can be easily converted to the focus setting value of the exposure apparatus. Also, the relative positional relationship in the optical axis direction between the other spatial image openings 6b and 6c, and the spatial image opening 6a is fixed by the structure of the spatial image projection plate 6. Therefore, by measuring the surface position of the focus standard position confirmation body 16, the height of each spatial image opening 6a, 6b, 6c from the surface of the wafer stage 15 can be calculated to the focus setting value of the exposure apparatus.

In the present embodiment, the spatial image projection plate 6 arranges an opening in a flat plate and is made to slant, the difference in height 61 between the spatial image openings 6a and 6c is the same as the difference in height 62 between the spatial image openings 6a and 6b. The differences 61, 62 correspond to the measurement pitch on the horizontal axis in the graph shown in FIG. 2. For example, by making the differences 61, 62 to be 0.1 μm, the focus curve can be obtained with the focus setting value of 0.1 μm pitch change. Although a description is provided in FIG. 1 of a constitution in which the three spatial image marks and spatial image openings are used, the focus curve with a single exposure can be obtained for the focus setting value of the exposure apparatus changed to 2 to 3 μm if adopting a constitution that provides 20 to 30 spatial image marks and spatial image openings of differing positions in the optical axis direction.

According to the present embodiment described above, the spatial image mark images of the same planer shape are respectively projected to each spatial image openings of the spatial image projection plate providing the spatial image openings of differing positions in the optical axis direction, and optical intensities of the images of each of the spatial image marks can be simultaneously obtained. In other words, the best focus position can be calculated with a single exposure without moving the wafer stage 15 in the optical axis direction. As a result, the best focus position can be calculated within an extremely short period of time.

In the present embodiment, the best focus position described above is implemented by a calculation unit 23 provided by the control unit 22. For example, the calculation unit 23 calculates the focus curve shown in FIG. 2 by using known interpolation and calculates the height from the wafer stage 15 where the focus curve becomes an extreme value, based on the optical intensities measured by each of the individual light receiving sensors 21a, 21b, 21c and the height from the wafer stage 15 of each of the spatial image openings 6a, 6b, 6c set in advance. And also, the calculation unit 23 converts the height from the wafer stage 15 where the focus curve becomes an extreme value to the focus setting value of the exposure apparatus based on the surface position of the focus standard surface confirmation body 16 measured by the AF system 50. The calculation unit 23 can be realized for example by hardware having a processor and a memory such as RAM (Random Access memory) or ROM (Read Only Memory), etc. and software stored in the memory and operating on the processor.

Meanwhile, a semiconductor device can be manufactured by using the exposure apparatus described above in the following manner. First, a wafer 12 forming the semiconductor device is mounted to the wafer holder 11 of the wafer stage 15. Next, the spatial image mark body 4 is arranged on the optical path of the exposure light 1, and at the same time the spatial image projection plate 6 is arranged on the optical path of the exposure light passed through the projection lens 5. Here, the control unit 22 moves the reticle stage 2 and puts the center spatial image mark 4a of the spatial image mark body 4 in a position on the optical axis of the exposure light 1. Further, the control unit 22 moves the wafer stage 15 to put the spatial image opening 6a in a position on the optical axis of the exposure light passed through the projection lens 5. In such a state, the exposure light 1 is irradiated and the optical intensities of each of the spatial image marks is measured by each of the individual light receiving sensors 21a, 21b, 21c. Continuing, the calculation unit 23 calculates, as described above, the focus setting value of the exposure apparatus that becomes the best focus position. The calculation unit 23 sets the calculated focus setting value to the AF system 50 as the best focus position.

After completing the setting of the best focus position, the control unit 22 moves the reticle stage 2 to put the element pattern 3a of the reticle 3 into a position on the optical axis of the exposure light source, and at the same time the control unit 22 moves the wafer stage 15 to put an exposure area (exposure shot) of the wafer 12 arranged on the wafer holder 11 into a position on the optical axis of the exposure light source. The AF system 50 calculates the focus offset and leveling offset so that the surface position of the exposure area of the wafer 12 matches to the established best focus position. The calculated focus offset and leveling offset is notified to the control unit 22. The control unit 22 controls the drive mechanism of the wafer stage not shown in the drawing based on the notified focus offset and leveling offset and, implements the focusing and leveling of the wafer stage 15. Thereafter, in such a state, exposure is performed on a resist film (photosensitive resin film) applied on the wafer 12. Moreover, the calculation of the best focus position described above is preferably performed in every wafer exposure process, but may also be performed in exposure process each of predetermined number of wafers in a single lot.

According to the manufacturing method described above, an exposure process which optimizes the focus for each substrate without reducing the throughput in exposure process of wafers per lot unit. As a result, control of the focus variance is possible between each wafer belonging to the same lot without reducing throughput thereby enabling to reduce in manufacturing cost.

Because the present invention, as described above, has the ability to calculate and adjust the best focus position in an extremely short period of time, namely $1/10^{th}$ to $1/20^{th}$, compared to the conventional art, the focus on each single wafer can be adjusted to the best focus without reducing throughput in an exposure process to mass produce a semiconductor device. As a result, the focus variance can be controlled between each wafer belonging to the same lot without reducing throughput thereby enabling to reduce in manufacturing cost. The present invention has a particular effect in the manufacture of a semiconductor device using a process node lower than the 100 nm, such as a 65 nm or 45 nm, that is required for particularly precise resist patterns and cross-section management.

Moreover, the present invention can be utilized in a variety of shapes and applications within the scope of the technical idea of the present invention without being limited to the embodiment described above. For example, in the present embodiment, an explanation is given that the exposure system of the present invention is as a single exposure apparatus; however, a calculation unit 23 can be equipped outside the exposure apparatus. Further, the composition described above used detectors to detect the intensities of the exposure light passed through an opening, but any structure can be adopted if the structure has the ability to measure the intensities of the image of a spatial image mark projected onto a spatial image projection plate. Further, in the embodiment described above, an explanation is given that a structure in which a spatial image projection plate is arranged on the wafer stage and a spatial image mark body is arranged on the reticle stage, but a structure that allows the spatial image mark body and the spatial image projection plate to be movable independently across outside the optical path and on the optical path of the exposure light can also be adopted.

The present invention contributes to perform an exposure by optimizing the focus for each wafer to the best focus without reducing throughput, and is useful as an exposure system and a manufacturing method of a semiconductor device.

What is claimed is:

1. An exposure system for projecting a pattern formed on a reticle mounted on a reticle stage through a projection lens onto a substrate where a photosensitive resin film is formed, the substrate mounted on a wafer stage, comprising:
   a spatial image mark body having a plurality of spatial image marks arranged in a same plane and placed between an exposure light source for irradiating an exposure light and the projection lens;
   a spatial image projection plate having a main surface that slants with respect to a substrate mounting surface of the wafer stage, and where the plurality of spatial image marks is simultaneously projected through the projection lens; and
   a plurality of detectors simultaneously detecting optical intensities of the images of the plurality of spatial image marks projected onto the spatial image projection plate, respectively, and wherein
   the spatial image projection plate has openings corresponding to each projection position of the images of spatial image marks projected onto the spatial image projection plate at the time that the exposure light enters the spatial image mark body, each opening is arranged in a different position in an optical axis direction of the exposure light and the exposure light passed through each opening is led to each of the detectors.

2. An exposure system according to claim 1, further comprising a unit adjusting a position of the wafer stage in the optical axis direction of the exposure light so that a surface position of the substrate mounted on the wafer stage becomes a best focus position calculated based on the optical intensities of the images of each spatial image mark.

3. An exposure system according to claim 2, further comprising a unit calculating automatically the best focus position based on the optical intensities of the images of each spatial image mark.

4. An exposure system according to claim 3, wherein the spatial image mark body is placed on the reticle stage, and the spatial image projection plate is placed on the wafer stage.

5. An exposure system according to claim 3 wherein the projection lens is a reduction projection lens.

6. An exposure system according to claim 2, wherein the spatial image mark body is placed on the reticle stage, and the spatial image projection plate is placed on the wafer stage.

7. An exposure system according to claim 2, wherein the projection lens is a reduction projection lens.

8. An exposure system according to claim 1, wherein the spatial image mark body is placed on the reticle stage, and the spatial image projection plate is placed on the wafer stage.

9. An exposure system according to claim 8, wherein a position of the wafer stage in the optical axis direction of the exposure light is fixed while the images of the plurality of spatial image marks are projected onto the spatial image projection plate.

10. An exposure system according to claim 1, wherein the projection lens is a reduction projection lens.

11. An exposure system according to claim 1, wherein the openings are arranged at even intervals in the optical axis direction of the exposure light.

12. A method of manufacturing a semiconductor device by using an exposure system for projecting a pattern formed on a reticle mounted on a reticle stage through a projection lens onto a substrate where a photosensitive resin film is formed, the substrate mounted on a wafer stage, comprising the steps of:

mounting a substrate onto the wafer stage;

placing a spatial image mark body on an optical axis of an exposure light between an exposure light source for irradiating the exposure light and the projection lens, the spatial image mark body having a plurality of spatial image marks arranged in a same plane;

placing a spatial image projection plate, in which a plurality of spatial image marks are projected through the projection lens, on the optical axis of the exposure light, the spatial image projection plate having a main surface that slants with respect to a substrate mounting surface of the wafer stage;

projecting the plurality of spatial image marks onto openings provided on the spatial image projection plate through the projection lens by irradiating the spatial image mark body with the exposure light, each of the openings being arranged in a different position in an optical axis direction of the exposure light on the spatial image projection plate;

detecting optical intensities of the images of the plurality of spatial image marks projected onto the openings in a single exposure;

calculating a best focus position based on the detected optical intensities;

correcting a focus setting value of the exposure system so that a surface position of the substrate mounted on the wafer stage becomes the calculated best focus position; and performing an exposure of the substrate by using the corrected focus setting value.

13. A method of manufacturing a semiconductor device according to claim 12, wherein the substrate belongs to a lot constituted from a plurality of substrates, and the correcting step of correcting the focus setting value of the exposure system is implemented for the exposure of each of a predetermined number of substrates contained in the lot.

14. A method of manufacturing a semiconductor device according to claim 13, wherein the calculating step calculates the best focus position by converting a position on the spatial image projection plate in the optical axis direction of the exposure light to a focus setting value, the position corresponding to an optical intensity representing an extreme value in a curve showing relations between optical intensity of each projected spatial image mark on each of the openings and the position of each of the openings in the optical axis direction of the exposure light at the position of each projected spatial image mark.

15. A method of manufacturing a semiconductor device according to claim 12, wherein the substrate belongs to a lot constituted from a plurality of substrates, and the correcting step of correcting the focus setting value of the exposure system is implemented in every exposure to each of the plurality of substrates contained in the lot.

16. A method of manufacturing a semiconductor device according to claim 15, wherein the calculating step calculates the best focus position by converting a position on the spatial image projection plate in the optical axis direction of the exposure light to a focus setting value, the position corresponding to an optical intensity representing an extreme value in a curve showing relations between optical intensity of each projected spatial image mark on each of the openings and the position of each of the openings in the optical axis direction of the exposure light at the position of each projected spatial image mark.

17. A method of manufacturing a semiconductor device according to claim 12, wherein the calculating step calculates the best focus position by converting a position on the spatial image projection plate in the optical axis direction of the exposure light to a focus setting value, the position corresponding to an optical intensity representing an extreme value in a curve showing relations between optical intensity of each projected spatial image mark on each of the openings and the position of each of the openings in the optical axis direction of the exposure light at the position of each projected spatial image mark.

18. A method of manufacturing a semiconductor device according to claim 12, wherein the spatial image projection plate is placed on the wafer stage and a position of the wafer stage in the optical axis direction of the exposure light is fixed in the step of projecting the plurality of spatial image marks onto openings.

19. A method of manufacturing a semiconductor device according to claim 12, wherein the openings are arranged at even intervals in the optical axis direction of the exposure light.

* * * * *